United States Patent
Hicks (10) Patent No.: US 8,373,317 B2
(45) Date of Patent: Feb. 12, 2013

(54) RFI SUPPRESSION SYSTEM AND METHOD OF MOUNTING FOR DC CORDLESS TOOLS

(75) Inventor: Walter Ernest Hicks, Elkins Park, PA (US)

(73) Assignee: Ingersoll Rand Company, Piscataway, NJ (US)

( * ) Notice: Subject to any disclaimer, the term of this patent is extended or adjusted under 35 U.S.C. 154(b) by 317 days.

(21) Appl. No.: 12/435,044

(22) Filed: May 4, 2009

(65) Prior Publication Data

US 2010/0277014 A1    Nov. 4, 2010

(51) Int. Cl.
*H02K 11/00* (2006.01)
*H02K 7/14* (2006.01)
*H02K 13/00* (2006.01)

(52) U.S. Cl. ............ 310/68 R; 310/50; 310/72; 310/249

(58) Field of Classification Search ................. 310/68 R, 310/72, 239, 229, 231, 233–234, 245, 248–249, 310/50, 89, 225
See application file for complete search history.

(56) References Cited

U.S. PATENT DOCUMENTS

| | | | |
|---|---|---|---|
| 2,450,809 A * | 10/1948 | Nader | 310/239 |
| 3,373,301 A * | 3/1968 | Black | 310/72 |
| 4,370,515 A | 1/1983 | Donaldson | |
| 4,370,579 A | 1/1983 | Kobayashi | |
| 4,384,223 A * | 5/1983 | Zelt | 310/68 R |
| 5,196,750 A | 3/1993 | Strobl | |
| 5,208,499 A | 5/1993 | Barber | |
| 5,341,274 A | 8/1994 | Wakita et al. | |
| 5,458,159 A | 10/1995 | Kilmer | |
| 5,734,212 A | 3/1998 | Uffelman | |
| 5,942,819 A | 8/1999 | Burgess | |
| 6,307,344 B1 | 10/2001 | Hause | |
| 6,400,058 B1 | 6/2002 | Liau | |
| 6,617,744 B2 | 9/2003 | Smith | |
| 6,737,779 B2 | 5/2004 | Natsuhara | |
| 6,768,243 B1 | 7/2004 | Yamazaki et al. | |
| 6,812,613 B1 | 11/2004 | Reynard | |
| 6,900,563 B2 | 5/2005 | Tyshchuk | |
| 7,291,957 B2 | 11/2007 | Vanwyck | |
| 2003/0048029 A1 | 3/2003 | DeDaran et al. | |
| 2004/0056540 A1 | 3/2004 | Kraenzler | |

(Continued)

FOREIGN PATENT DOCUMENTS

| | | | |
|---|---|---|---|
| JP | 2098192 A | 4/1990 | |
| JP | 2006123034 A | 5/2006 | |

(Continued)

OTHER PUBLICATIONS

Machine Translation JP2006211869 (2006).*
International Search Report for PCT/US2010/029594 filed Apr. 1, 2010, dated Jun. 2, 2010.

*Primary Examiner* — Quyen Leung
*Assistant Examiner* — Jose Gonzalez Quinones
(74) *Attorney, Agent, or Firm* — RatnerPrestia (57) ABSTRACT

A hand tool RFI suppression system comprising a DC motor having a conductive housing, a power supply and a suppression circuit board supporting at least one suppression assembly and at least one ground circuit electrically coupled to the suppression assembly. The suppression circuit board is mounted to the motor housing with the at least one suppression assembly electrically coupled in parallel between the power supply and the DC motor and the ground circuit is electrically coupled to the motor housing. A method of suppressing RFI in a power hand tool is also provided.

18 Claims, 5 Drawing Sheets

U.S. PATENT DOCUMENTS

| | | | |
|---|---|---|---|
| 2004/0183384 A1* | 9/2004 | Wang et al. | 310/51 |
| 2004/0232784 A1 | 11/2004 | Thomson | |
| 2005/0225195 A1* | 10/2005 | Simofi-Ilyes et al. | 310/239 |
| 2005/0239331 A1 | 10/2005 | Fisher | |
| 2007/0210672 A1* | 9/2007 | Fleminger et al. | 310/239 |

FOREIGN PATENT DOCUMENTS

| | | | |
|---|---|---|---|
| JP | 2006211869 A | * | 8/2006 |
| TW | 240767 Y | | 8/2004 |
| WO | WO 2005071821 A1 | | 8/2005 |

* cited by examiner

W600 Impact Wrench radiated emissions without the attenuator PC

Fig. 5A

W600 Impact Wrench radiated emissions with the attenuator PCB

Fig. 5B

Fig. 6

RFI SUPPRESSION SYSTEM AND METHOD OF MOUNTING FOR DC CORDLESS TOOLS

BACKGROUND OF THE INVENTION

The present invention relates to electric motors and more particularly to power circuits in electric motors and still more particularly to a direct current electric motor having an assembly for suppressing radio frequency interference.

Electric motors include a stator and a rotor which rotates about a central axis in response to opposing magnetic fields between the stator and the rotor. The opposing magnetic fields are typically induced by electric currents which flow in wire windings in the stator and rotor. Electric motors thereby convert electrical energy to mechanical energy in a rotating shaft which is attached to the rotor.

The electrical energy is supplied to a motor by electrical conductors which are connected to an external supply of electricity such as a battery or alternating current power lines. It is advantageous to provide a stable electrical power source to certain electric motors. For example, direct current (DC) motors require a stable direct current input having substantially no alternating current component. Electrical power circuits typically provide electricity including noise such as voltage surges and transient components. Electrical noise may be caused by any number of phenomena including, for example, power drains and surges and radio frequency disturbances which may be induced by alternating electromagnetic fields caused by near by electrical equipment.

Electrical power that is transmitted even a short distance through conductors acquires induced noise that was radiated through space. It is therefore impossible to provide a perfectly clean power signal over any substantial distance. Devices such as some electric motors which require clean power employ filter circuits proximate to their power input connections to remove most unwanted interference components in the electrical power signal.

Radio frequency interference (RFI) is typically filtered from power signals by filters comprising inductors and capacitors. It has been common practice in the motor industry to use common axial inductors in conjunction with common capacitors in the motor input circuit connected together as filter circuits which are well known in the electrical arts.

The electrical parameters or values of inductors and capacitors are related to their physical size. The effectiveness of a filter is related to the circuit parameters and therefore related to the physical size of the inductors and capacitors.

Typically, RFI suppression components are mounted on the outside of the motor or alternatively a motor package size is increased to accommodate the additional components. The amount of RFI suppression achieved by known designs is often limited by size constraints which are imposed upon the inductor and capacitor components.

Typical RFI suppression circuits are constructed by assembling the inductor and capacitor components to a motor assembly and electrically connecting them together to form the proper filter circuit. There is a need in the art for an RFI suppression package which reduces the size and complexity of the RFI suppression components and incorporates them into a package to speed production and maximize RFI suppression.

SUMMARY OF THE INVENTION

The present invention provides in one aspect a hand tool RFI suppression system comprising a DC motor having a conductive housing, a power supply and a suppression circuit board supporting at least one suppression assembly and at least one ground circuit electrically coupled to the suppression assembly. The suppression circuit board is mounted to the motor housing with the at least one suppression assembly electrically coupled in parallel between the power supply and the DC motor and the ground circuit is electrically coupled to the motor housing.

The present invention provides in another aspect a method of suppressing RFI in a power hand tool that includes a power supply and a DC motor having a conductive housing. The method includes mounting at least one suppression assembly on a PCB board with a ground circuit electrically coupled to the at least one suppression assembly; electrically coupling the at least one suppression assembly in parallel between the power supply and the motor; and electrically coupling the ground circuit to the motor housing.

In at least one embodiment, the present invention replaces the use of ferrite beads and multiple components such as inductors and capacitors used to filter RFI. By reducing the amount of hard wired components, the assembly time and cost will be reduced.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Figure 1:
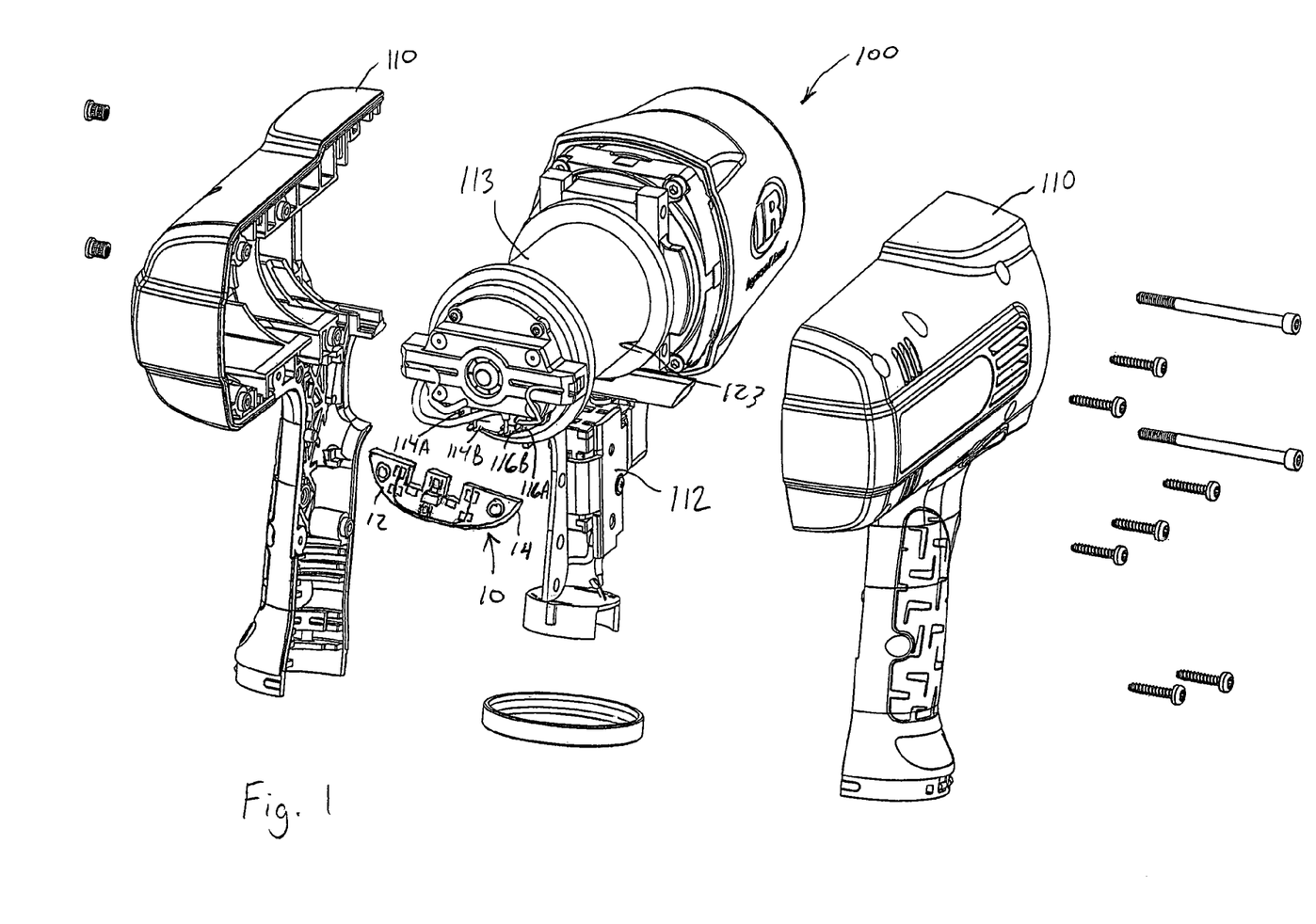
FIG. 1 is an exploded isometric view of a cordless power tool incorporating an exemplary embodiment of the suppression circuit board of the present invention.

Referring to FIGS. 1-4, a suppression circuit board 10 in accordance with a first exemplary embodiment of the invention will be described. In FIG. 1, an illustrative battery powered hand tool 100, for example, an impact wrench, is illustrated with its clamshell housing components 110 removed to show the DC motor 113 configured to drive the tool 100. While an impact wrench is illustrated, the present invention may be utilized with any other hand power tool. A switch 112 is electrically connected between a power source 111, for example, a battery (not shown), and the motor 113. In the present embodiment, connection is made through a motor voltage terminal 114A and a power voltage terminal 114B and a motor ground terminal 116A and a power ground terminal 116B.

Figure 2:
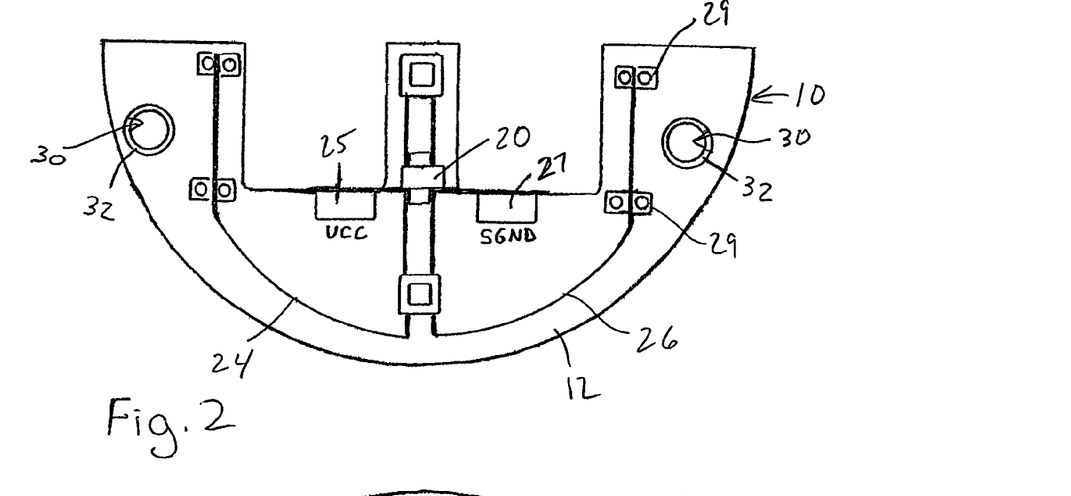
FIG. 2 is an elevation view of the suppression circuit board of FIG. 1.
Figure 3:
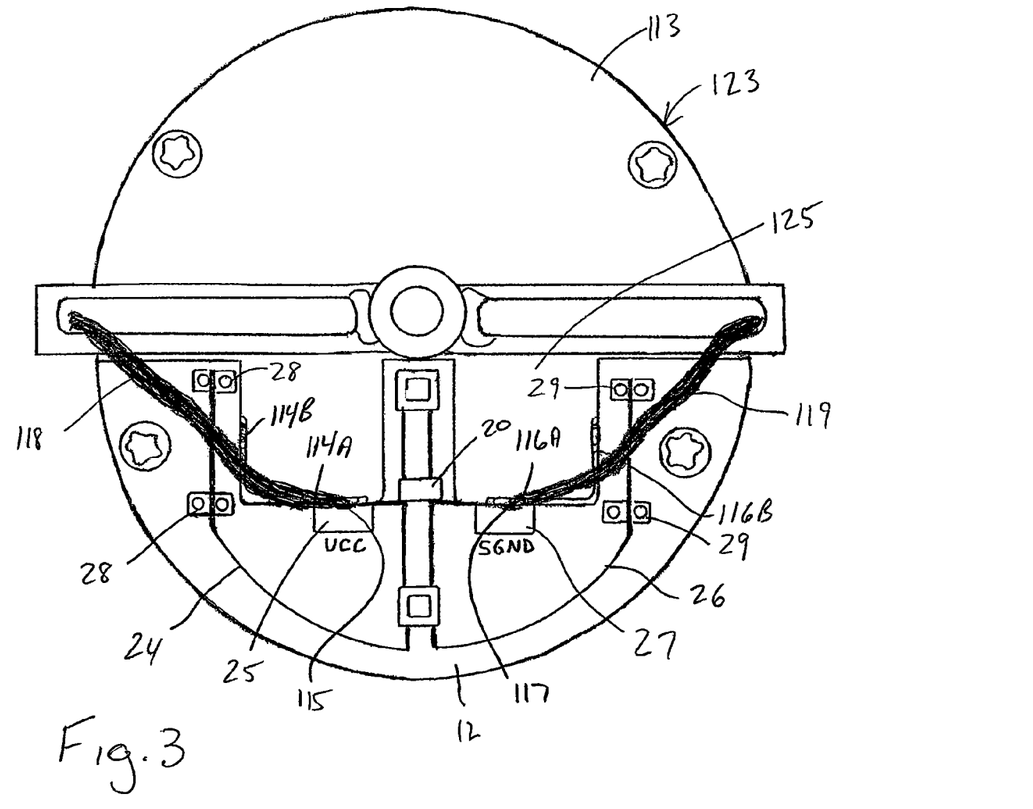
FIG. 3 is an elevation view of the suppression circuit board of FIG. 1 attached to the motor of the cordless power tool.

The suppression circuit board 10 of the current embodiment of the present invention is configured to be connected in parallel between the motor terminals 114A and 116A and the power terminals 114B and 116B. Referring to FIG. 2, the suppression circuit board 10 includes a PCB board 12 with various components mounted thereon. A voltage contact 25 is positioned along an edge of the board 12 and is positioned to align adjacent to the motor voltage terminal 114A. Similarly, a ground contact 27 is positioned along an edge of the board 12 and is positioned to align adjacent to the motor ground terminal 116A. As shown in FIG. 3, the close positioning allows the motor voltage terminal 114A to be soldered directly to the voltage contact 25 at 115 and the motor ground terminal 116A to be soldered directly to the ground contact 27 at 117. While the contacts 25, 27 are shown adjacent to the motor terminals 114A and 116A, they can alternatively be positioned adjacent to the power contacts 114B and 116B or a combination thereof. Minimal distance between the contacts and the terminals prevents noise from bypassing/coupling around the suppression assembly 20.

Figure 4:
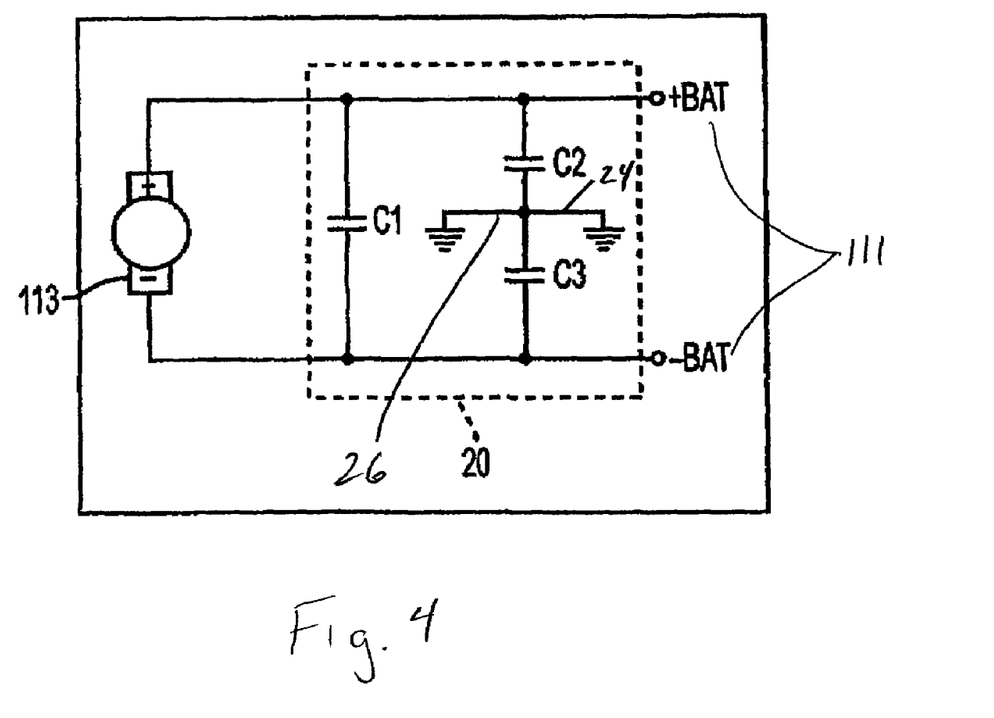
FIG. 4 is an schematic circuit diagram of the attenuator of the suppression circuit board of the present exemplary embodiment.

The voltage contact 25 is electrically connected to a first terminal of the suppression assembly 20 while the ground contact 27 is connected to a second terminal of the suppression assembly 20 such that the suppression assembly 20 is connected in parallel between the power source 111 and the motor 113 as illustrated in FIG. 4. In the present embodiment, the suppression assembly 20 is an X2Y attenuator as described at http://www.X2Y.com. The X2Y attenuator provides a pair of terminals along with a pair of ground terminals. Other components, including various capacitors and inductors, and other configurations may alternatively be utilized as the suppression assembly 20.

The suppression assembly 20 of the present embodiment provides a pair of ground circuits 24 and 26, each with one or more ground circuit contacts 28, 29. Each of the ground contacts 28, 29 extends to a ground plane 14 on the underside of the PCB board 12. The ground plane 14 may be a continuous surface or may define discrete contact points The PCB board 12 is configured to be mounted directly to an end cap 125 of the conductive motor housing 123 with the ground plane 14 in direct contact with the motor housing 123. The PCB board 12 may be soldered to the end cap 125, soldered to the terminals 114, 116, connected via screws (not shown) passing through screw holes 30, or otherwise connected. If screws are utilized, it is preferable that the screw holes 30 includes a conductive contact area 32 such that connection of the screws provides a conductive ground path between the suppression assembly 20 and the motor housing 123. With such a configuration, the ground path may be provided via the contact of the ground plane 14 with the motor housing 123, the screw contact with the motor housing 123 or a combination thereof. With the PCB board 12, and thereby the suppression assembly 20, electrically coupled to the motor housing 123, the motor frame provides a virtual ground for the suppression assembly 20 to direct energy captured by the suppression assembly 20.

In an alternative embodiment, the PCB board 12 may additionally be used to support the brushes of the motor 113 and perform the end cap 125 function. In such an embodiment, the ground plane 14 may be configured to contact a conductive surface within the motor housing 123 and/or screws may be utilized to provide the ground path between the between the suppression assembly 20 and the motor housing 123.

Figure 5A:
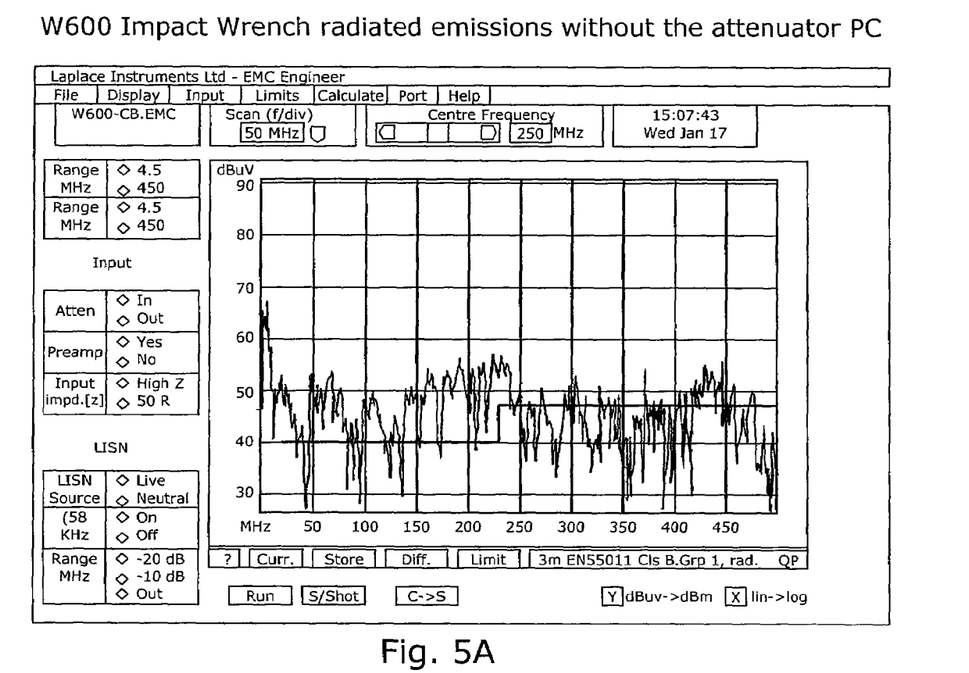
FIG. 5A is a graph of the radiated emissions of a tested impact wrench without a suppression circuit board of the present invention.
Figure 5B:
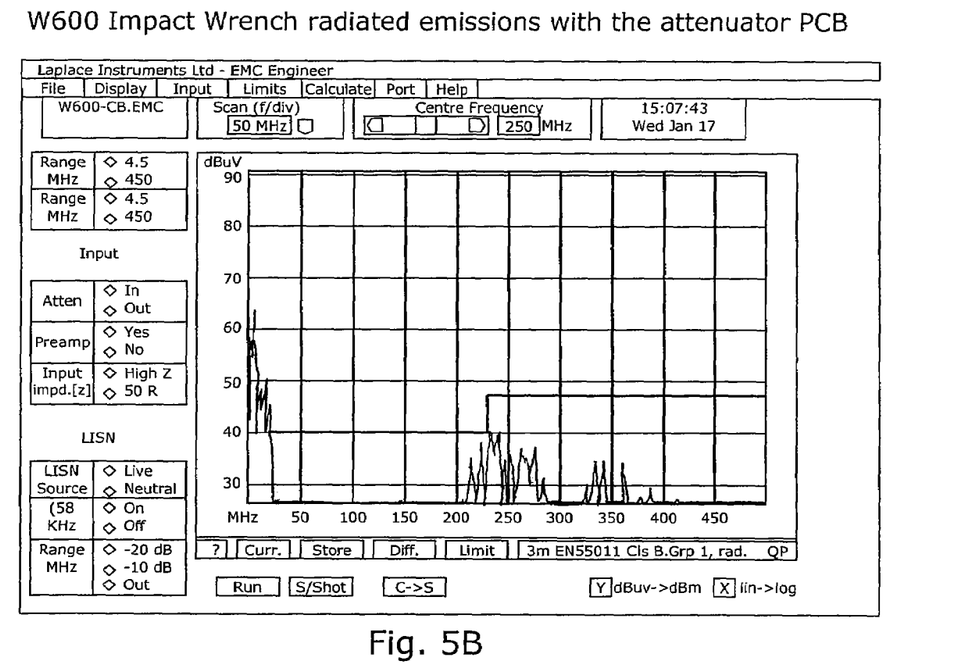
FIG. 5B is a graph of the radiated emissions of a tested impact wrench with a suppression circuit board of the present invention.

Referring to FIGS. 5A and 5B, the improved RFI suppression of the suppression circuit board 10 is shown. FIG. 5A shows the detected radiated emissions from an impact wrench not including a suppression circuit board in accordance with the invention. FIG. 5B shows the detected radiated emissions from an impact wrench that includes a suppression circuit board 10 in accordance with the invention. The amount of detected radiated emissions is significantly less with the hand tool utilizing a suppression circuit board 10 in accordance with the invention.

The suppression circuit board 10 improves RFI suppression and eliminates the use of multiple components wired together to form an RFI filter. Furthermore, the suppression circuit board 10 is smaller, more conveniently packaged and is less costly than competitive techniques.

Figure 6:
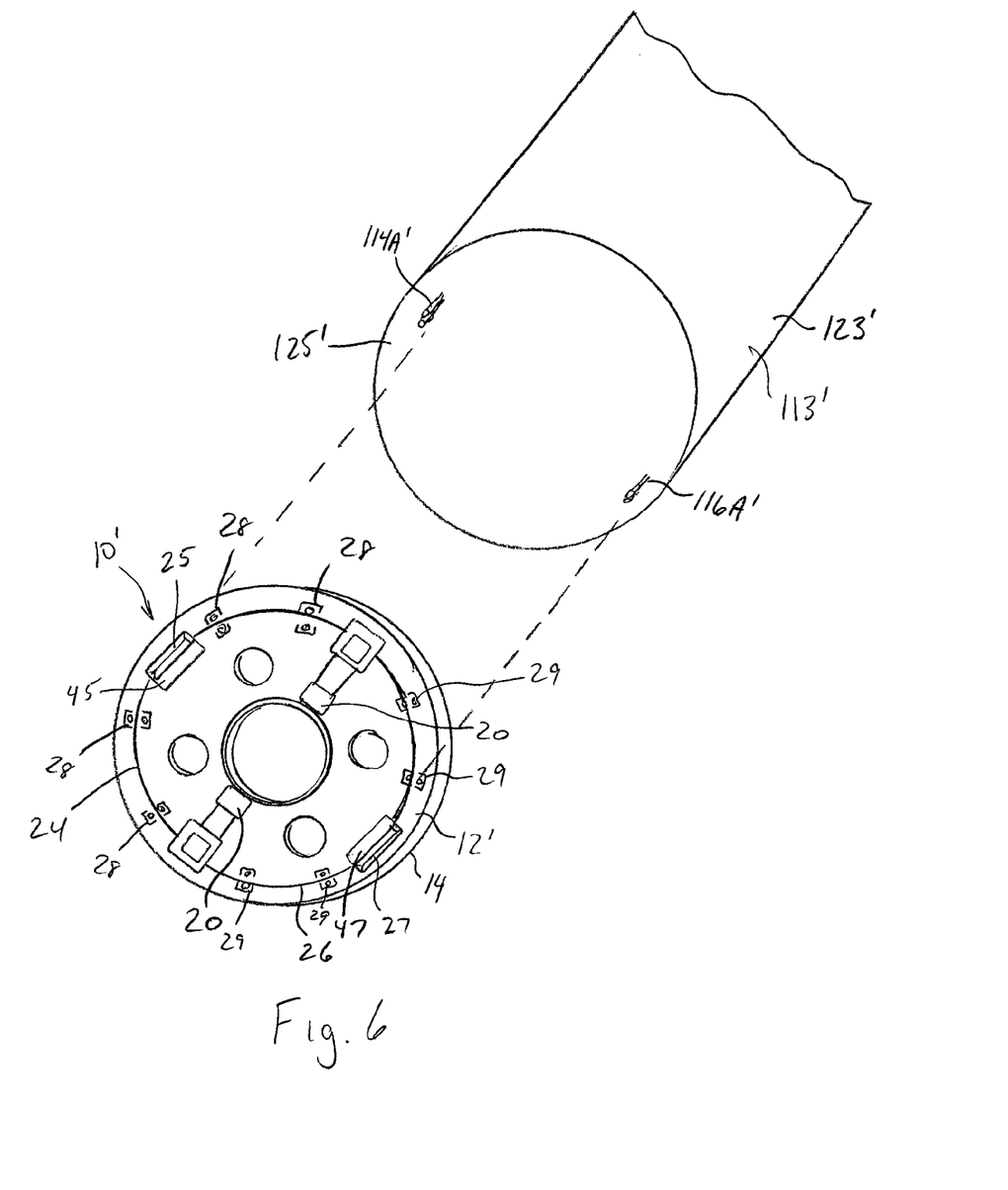
FIG. 6 is an exploded isometric view of an alternative exemplary suppression circuit board and motor.

Referring to FIG. 6, a suppression circuit board 10' in accordance with an alternative embodiment of the invention is shown. The suppression circuit board 10' is shown configured for connection to a brushless DC motor 113' having a motor voltage terminal 114A' and a motor ground terminal 116A'. The terminals 114A' and 116A' are configured for direct connection to wires from the power supply 111.

The suppression circuit board 10' is similar to the previous embodiment and includes a PCB board 12'. In this embodiment, the PCB board 12' has a circular configuration. The configuration of the PCB board 12, 12' in each embodiment may be selected based on the configuration of the motor and other components of the hand tool. As in the previous embodiment, a rear surface of the PCB board 12' will define a ground plane 14. Again, the ground plane 14 may be a continuous surface or may define discrete contact points.

As in the previous embodiment, the PCB board 12' includes a voltage contact 25 configured to align adjacent to the motor voltage terminal 114A' and a ground contact 27 configured to align adjacent to the motor ground terminal 116A. In the present embodiment, the contacts 25, 27 are positioned adjacent through holes 45 and 47, respectively, such that the terminals 114A' and 116A' pass therethrough. Again, the close positioning allows the motor voltage terminal 114A' to be soldered directly to the voltage contact 25 and the motor ground terminal 116A' to be soldered directly to the ground contact 27 at 117. Minimal distance between the contacts and the terminals prevents noise from bypassing/coupling around the suppression assembly 20.

The voltage contact 25 is electrically connected to the first terminals of a pair of suppression assemblies 20 while the ground contact 27 is connected to second terminals of the suppression assemblies 20 such that the suppression assemblies 20 are connected in parallel between the power source 111 and the motor 113. Again, the suppression assemblies 20 may take the form of an X2Y attenuator, but other components, including various capacitors and inductors, and other configurations may alternatively be utilized as the suppression assemblies 20.

The suppression assemblies 20 of the present embodiment provide a pair of ground circuits 24 and 26, each with one or more ground circuit contacts 28, 29. Each of the ground contacts 28, 29 extends to a ground plane 14 on the underside of the PCB board 12'. The ground plane 14 may be a continuous surface or may define discrete contact points The PCB board 12' is configured to be mounted directly to the end cap 125' of the conductive motor housing 123' with the ground plane 14 in direct contact with the motor housing 123'. The PCB board 12' may be soldered to the end cap 125', soldered to the terminals 114A', 116A', connected via screws (not shown) passing through screw holes, or otherwise connected. As in the previous embodiment, a ground path may be provided via the contact of the ground plane 14 with the motor housing 123', the screw contact with the motor housing 123' or a combination thereof. With the PCB board 12', and thereby the suppression assemblies 20, electrically coupled to the motor housing 123', the motor frame provides a virtual ground for the suppression assemblies 20 to direct energy captured by the suppression assemblies 20.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A hand tool RFI suppression system comprising:
a DC motor having a conductive housing;
a power supply;
a suppression circuit board supporting at least one suppression assembly and at least one ground circuit electrically coupled to the suppression assembly;
wherein the suppression circuit board is mounted to the motor housing with the at least one suppression assembly electrically coupled in parallel between the power supply and the DC motor and the ground circuit is electrically coupled to the motor housing and wherein the motor includes a motor voltage terminal and a motor around terminal, and the suppression circuit board includes a ground contact that is electrically connected to the motor ground terminal without wires and a voltage contact that is electrically connected to the motor voltage terminal without wires, wherein the voltage contact is electrically connected to a terminal of the suppression assembly and the ground contact is electrically connected to another terminal of the suppression assembly to suppress RFI.

2. The hand tool suppression system of claim 1, wherein the voltage and ground contacts are positioned along one or more edges of the suppression circuit board.

3. The hand tool suppression system of claim 1, wherein the voltage and ground contacts are positioned along respective through holes through the suppression circuit board.

4. The hand tool suppression system of claim 1, wherein the voltage and ground contacts are positioned to be soldered to the respective terminals.

5. The hand tool suppression system of claim 1, wherein the at least one suppression assembly includes an X2Y attenuator.

6. The hand tool suppression system of claim 1, wherein the at least one suppression assembly includes at least one capacitor, at least one inductor or a combination thereof.

7. The hand tool suppression system of claim 1, comprising at least two suppression assemblies, each suppression assembly electrically coupled to the at least one ground circuit.

8. The hand tool suppression system of claim 1, wherein the at least one ground circuit is electrically coupled to a ground plane of the suppression circuit board and the suppression circuit board is mounted with the ground plane in direct contact with the motor housing.

9. The hand tool suppression system of claim 8, wherein the at least one ground circuit includes at least one ground contact electrically coupled with the ground plane.

10. The hand tool suppression system of claim 1, wherein at least one screw extends between the suppression circuit board and the motor housing and is electrically coupled to the at least one ground circuit and the motor housing.

11. The hand tool suppression system of claim 1, wherein the DC motor is a brushed motor.

12. The hand tool suppression system of claim 1, wherein the DC motor is a brushless motor.

13. The hand tool suppression system of claim 1, wherein the suppression circuit board includes a PCB board.

14. A method of suppressing RFI in a power hand tool, the power hand tool including a power supply and a DC motor having a conductive housing, comprising the step of:
mounting at least one suppression assembly on a PCB board with a ground circuit electrically coupled to the at least one suppression assembly;
electrically coupling a ground contact of the PCB board to a motor ground terminal of the DC motor without wires;
electrically coupling a voltage contact of the PCB board to a motor voltage terminal of the DC motor without wires;
electrically coupling the voltage contact of the PCB board to a terminal of the suppression assembly to suppress RFI;
electrically coupling the ground contact of the PCB board to another terminal of the suppression assembly to suppress RFI; and
electrically coupling the ground circuit to the motor housing.

15. The method of claim 14, wherein the PCB board includes a ground plane and the step of electrically coupling the ground circuit to the motor housing includes mounting the PCB board with the ground plane in direct contact with the motor housing.

16. The method of claim 14, wherein the step of electrically coupling the ground circuit to the motor housing includes mounting the PCB board with at least one screw electrically coupled between the ground circuit and the motor housing.

17. The method of claim 14, wherein the at least one suppression assembly includes an X2Y attenuator.

18. The method of claim 14, wherein the at least one suppression assembly includes at least one capacitor, at least one inductor or a combination thereof.

* * * * *

UNITED STATES PATENT AND TRADEMARK OFFICE
CERTIFICATE OF CORRECTION

PATENT NO. : 8,373,317 B2
APPLICATION NO. : 12/435044
DATED : February 12, 2013
INVENTOR(S) : Walter Ernest Hicks It is certified that error appears in the above-identified patent and that said Letters Patent is hereby corrected as shown below:

In the Claims

Claim 1, column 5, line 25, "around" should read -- ground --.

Signed and Sealed this
Twenty-third Day of April, 2013

Teresa Stanek Rea
*Acting Director of the United States Patent and Trademark Office*